(12) United States Patent
Wu et al.

(10) Patent No.: US 6,453,915 B1
(45) Date of Patent: Sep. 24, 2002

(54) POST POLYCIDE GATE ETCHING CLEANING METHOD

(75) Inventors: Chih-Ning Wu, Hsinchu; Chan-Lon Yang, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 114 days.

(21) Appl. No.: 09/607,022

(22) Filed: Jun. 29, 2000

(30) Foreign Application Priority Data

Jun. 16, 2000 (TW) .......................................... 89111824

(51) Int. Cl.[7] ........................................... H01L 21/302
(52) U.S. Cl. .................. 134/1.2; 438/725; 438/734; 438/750; 438/704; 438/717; 134/1.3; 216/57
(58) Field of Search .................. 134/1.2, 1.3; 216/57; 438/725, 734, 750, 704, 717

(56) References Cited

U.S. PATENT DOCUMENTS 5,780,406 A * 7/1998 Honda et al. ................ 510/175
6,030,932 A * 2/2000 Leon et al. .................. 510/175
6,245,155 B1 * 6/2001 Leon et al. .................... 134/3

* cited by examiner

*Primary Examiner*—George Goudreau
(74) *Attorney, Agent, or Firm*—J.C. Patents

(57) ABSTRACT

A method of cleaning polycide gates after an etching step. A gate oxide layer, a polysilicon layer, a titanium nitride layer, a silicide layer, an anti-reflection layer and a patterned photoresist layer are sequentially formed over a substrate. An etching operation is next carried out to form a gate structure. The gate structure is formed by patterning the polysilicon layer, the titanium nitride layer and the silicide layer. The gate structure is subsequently cleaned in a three-step cleaning operation. In the first cleaning step, minute amount of fluoride-containing compound, hydrogen and inert gas are used as gaseous reactants in a plasma-cleaning operation. The fluoride-containing compound is capable of initiating a free radical chain reaction. In the second cleaning step, a solvent containing ammonium ions is applied to the gate structure. In the third cleaning step, a solution formed by dissolving oxidizing agent in de-ionized water is applied.

21 Claims, 4 Drawing Sheets

POST POLYCIDE GATE ETCHING CLEANING METHOD

CROSS-REFERENCE TO RELATED APPLICATION

This application claims the priority benefit of Taiwan application Ser. No. 89111824, filed Jun. 16, 2000.

BACKGROUND OF THE INVENTION

1. Field of Invention

The present invention relates to a method of manufacturing integrated circuits. More particularly, the present invention relates to a method of cleaning polycide gates after etching.

2. Description of Related Art

FIG. 1A is a cross-sectional view of a conventional polycide gate on a substrate 100. To form the polycide gate on the substrate 100, a gate oxide layer 102, a polysilicon layer 104, a titanium nitride layer 106, a silicide layer 108 and a oxy-nitride layer (SiON) 110 are sequentially formed over a substrate 100. Photolithographic and etching processes are next conducted to form a gate 112 having a residual photoresist layer 114 thereon.

In fact, the gate 112 that includes the polysilicon layer 104, the titanium nitride layer 106 and the silicide layer 108 are known collectively as a polycide gate. The titanium nitride layer 106 functions as a barrier layer. The oxy-nitride layer 110 is an anti-reflection layer. Because line width of the gate 112 needs to be very accurate, an anisotropic dry etching such as reactive ion etching must be used. During the etching step, a layer of high molecular weight film 116 is normally formed on the sidewalls of the gate structure 112.

After the formation of the titanium polycide gate, a conventional dry etching operation such as plasma ashing is carried out. A conventional wet cleaning is next carried out using a solvent cleaner. However, a residual high molecular weight film 116 still clings to the sidewalls of the gate structure.

Gaseous reactants within the reactive plasma for dry cleaning are sometimes changed in an attempt to reduce the amount of high molecular weight film 116 clinging to the sidewalls of the gate. The dry plasma cleaning is generally carried out at a high temperature (e.g. 250° C.). It is found, however, that plasma without any fluoride content can hardly remove high molecular weight residues. Although plasma with fluoride and oxygen is capable of improving cleaning performance, the plasma also erodes the gate oxide layer 102 and the sidewalls of the titanium nitride layer (that is, the barrier layer 106). FIG. 1B is a cross-sectional view of a conventional polycide gate on a substrate after a dry cleaning operation using plasma that contains fluoride and oxygen. Undercutting of the titanium nitride layers 106, 110 and the gate oxide layer 102 is clearly shown in FIG. 1B.

SUMMARY OF THE INVENTION

Accordingly, one object of the present invention is to provide a method of cleaning polycide gates after an etching step so that residual high molecular weight film on the gate sidewalls is removed.

A second object of this invention is to provide a method of cleaning polycide gates capable of maintaining integrity of the sidewalls of a titanium nitride layer and a gate oxide layer.

To achieve these and other advantages and in accordance with the purpose of the invention, as embodied and broadly described herein, the invention provides a method of cleaning polycide gates after an etching step. A gate oxide layer, a polysilicon layer, a titanium nitride layer, a silicide layer, an anti-reflection layer and a patterned photoresist layer are sequentially formed over a substrate. An etching operation is next carried out to form a gate structure. The gate structure is formed out of the patterned polysilicon layer, the titanium nitride layer and the silicide layer. The gate structure is subsequently cleaned in a three-step cleaning operation. In the first cleaning step, minute amount of fluoride-containing compound, hydrogen and inert gas are used as gaseous reactants in a low-temperature plasma-cleaning operation. The fluoride-containing compound is capable of initiating a free radical chain reaction. In the second cleaning step, a solvent containing ammonium ions is applied to the gate structure. In the third cleaning step, a solution formed by dissolving oxidizing agent in de-ionized water is applied.

In the first cleaning step, reaction temperature of the plasma is about 80 to 150° C. and the reaction chamber is at a pressure of about 0.6 to 0.9 torr. The inert gas can be nitrogen, for example. The fluoride-containing compound can be, for example, carbon tetrafluoride and trifluoromethane. In addition, ratio between the fluoride-containing compound and the inert gas is preferably between 0.01 to 0.03 while the ratio between the hydrogen and the inert gas is preferably about 0.04. In the second cleaning step, the ammonium compound solvent can be commercial product ACT 935 or ACT 970, for example. in the third cleaning step, the amount of oxidizing agent within the de-ionized water is preferably between 40 to 60 ppm. The oxidizing agent can be ozone, for example.

Since a small amount of fluoride-containing compound capable of triggering free radical chain reaction is used at a low temperature, photoresist material is removed efficiently. On the other hand, because only minute amount of fluoride-containing compound is used at a low temperature, erosion of the titanium nitride layer is prevented. In addition, any residual photoresist and organic high molecular substrate are removed by the subsequently applied ammonium compound solvent and the oxidizing solution. Hence, the gate structure is thoroughly cleaned without causing any conventional problems.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
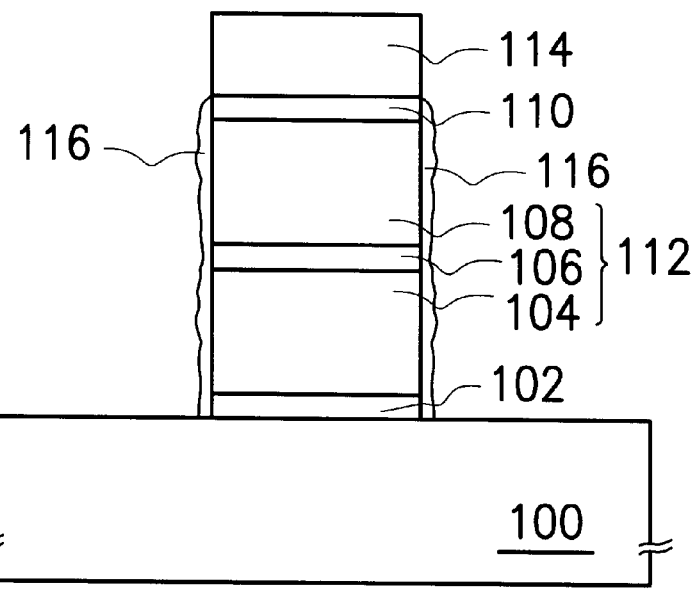
FIG. 1A is a cross-sectional view of a conventional polycide gate on a substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
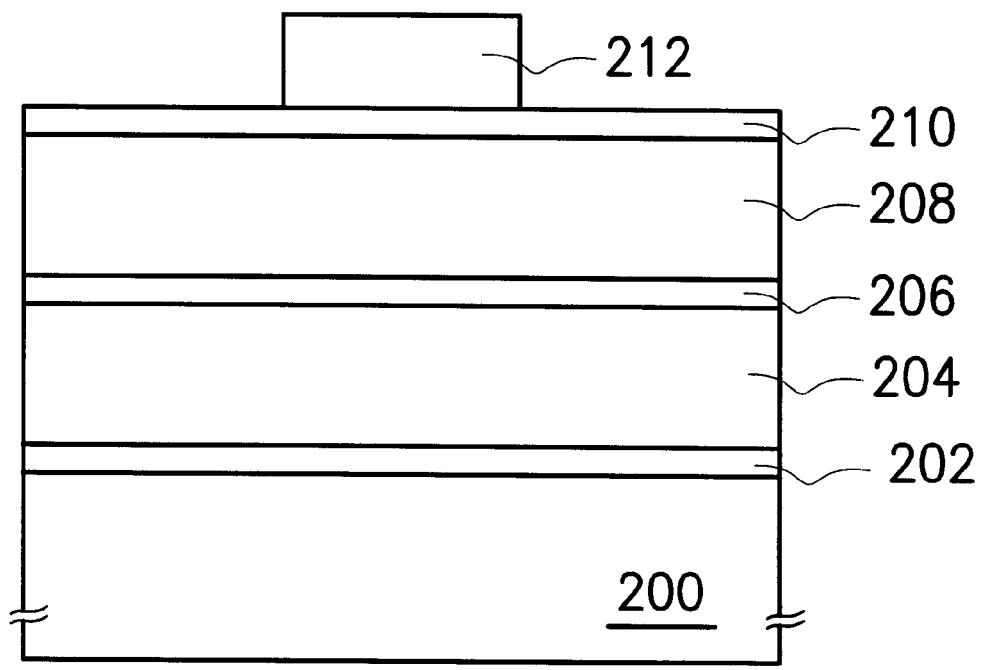
FIGS. 2A through 2C are cross-sectional views showing the progression of steps for producing a polycide gate according to this invention.
Figure 2B:
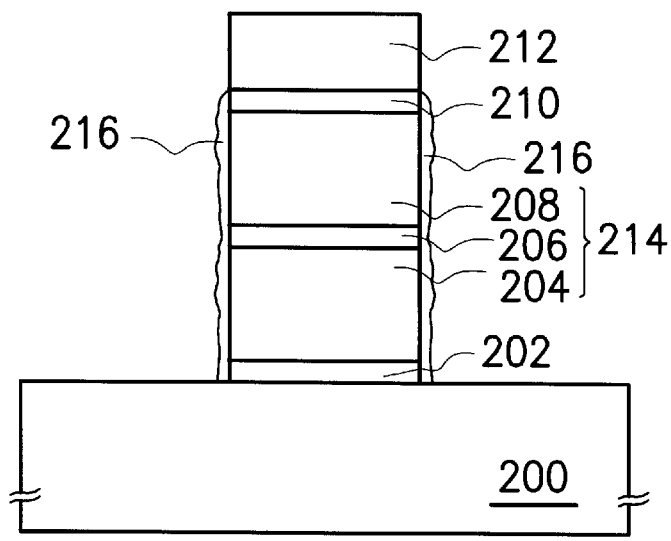
Figure 2C:
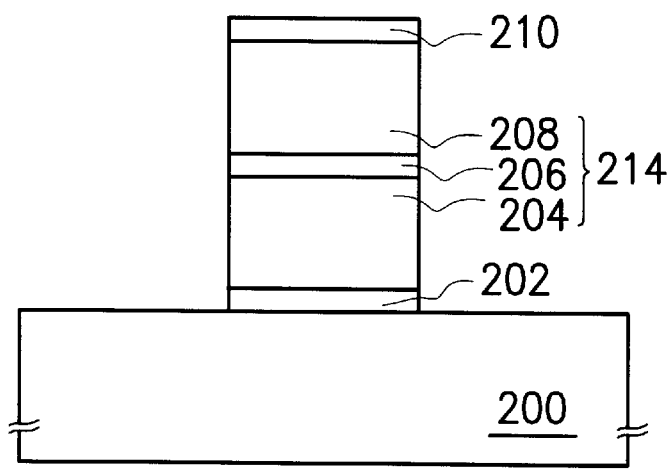

FIGS. 2A through 2C are cross-sectional views showing the progression of steps for producing a polycide gate according to this invention. As shown in FIG. 2A, a gate oxide layer 202, a polysilicon layer 204, a barrier layer 206 (for example, a titanium nitride layer), a silicide layer 208 (for example, a oxynitride layer), an anti-reflection layer 210 (for example, a titanium nitride layer) and a patterned photoresist layer 212 are sequentially formed over a substrate 200.

As shown in FIG. 2B, a polycide gate 214 is formed by performing an etching operation. Reactive gases including carbon tetrafluoride ($CF_4$), sulfur hexafluoride ($SF_6$), chlorine gas ($Cl_2$) and hydrogen chloride gas (HCl) are used to etch the silicide layer 208. Reactive gases including chlorine gas ($Cl_2$), hydrogen chloride gas (HCl), hydrogen bromide gas (HBr) and silicon tetrachloride ($SiCl_4$) are used to etch the polysilicon layer 204. In general, the effect of an anisotropic etching on the polysilicon layer 204 needs to be enhanced so that sidewall profile of the gate 214 is dimensionally precise. Consequently, a small amount of carbon tetrafluoride ($CF_4$) and a small amount of trichloromethane ($CHF_3$) are added to the reactive gases. The added compounds will form a layer of high molecular film 216 on the sidewalls of the gate structure 214 during etching so that corrosion of the sidewalls are prevented.

Figure 3:
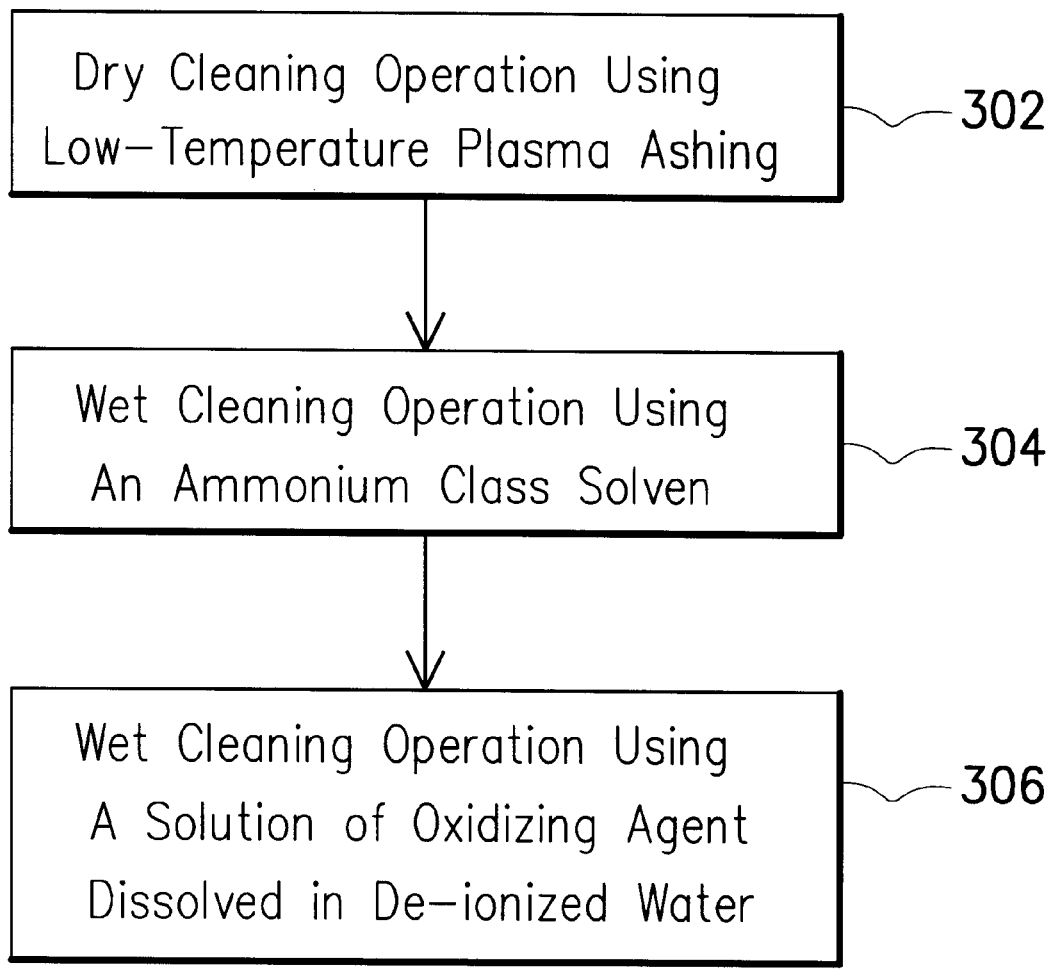
FIG. 3 is a flow chart showing the steps for cleaning the polycide gate after a polycide gate patterning operation.

FIG. 3 is a flow chart showing the steps for cleaning the polycide gate after a polycide gate patterning operation. First, a dry cleaning step 302 is carried out. The dry cleaning step 302 is a low-temperature plasma ashing operation capable of removing a large portion of the photoresist layer 212 and the high molecular weigh film 216 (as shown in FIG. 2B).

The low-temperature plasma ashing step 302 is carried out at a temperature of between about 80 to 150° C. in a chamber having a pressure of between about 0.6 to 0.9 torr. The gases used to generate the plasma include a fluoride-containing compound, a hydrogen gas and an inert gas. The fluoride-containing compound can be carbon tetrafluoride or trichloromethane, for example. The inert gas can be gaseous nitrogen, for example. Ratio between the fluoride-containing compound and the inert gas is preferably between 0.01 to 0.03. Ratio between the hydrogen gas and the inert gas is preferably about 0.04. The gaseous nitrogen actually serves as a carrier gas. The fluoride-containing compound and the hydrogen gas serves as reactive gases. The plasma can be, for example, inductively coupled plasma (ICP).

In the dry cleaning step, only a small amount of fluoride-containing compound is used. The amount of fluoride-containing compound is sufficient as long as free radical chain reaction can be initiated. Using carbon tetrafluoride as an example, the possible mechanism of reaction is described as follows.

Inside a plasma generator, the carbon tetrafluoride molecules dissociate into fluoride free radicals F. and carbon difluoride (: $CF_2$) (as shown in chemical formula 1). The fluoride free radicals will undergo a free radical chain reaction with organic high molecular weight molecules leading to the fragmentation of the photoresist layer 212 and the high molecular weight film 216. This type of free radical dissociation is similar to a reverse polymerization. The reacted fragments are sucked away by the vacuum pump in a vacuum system.

$$CF_{4(g)} \rightarrow 2F_{\cdot(g)} + CF_{2(g)} \tag{1}$$

Figure 1B:
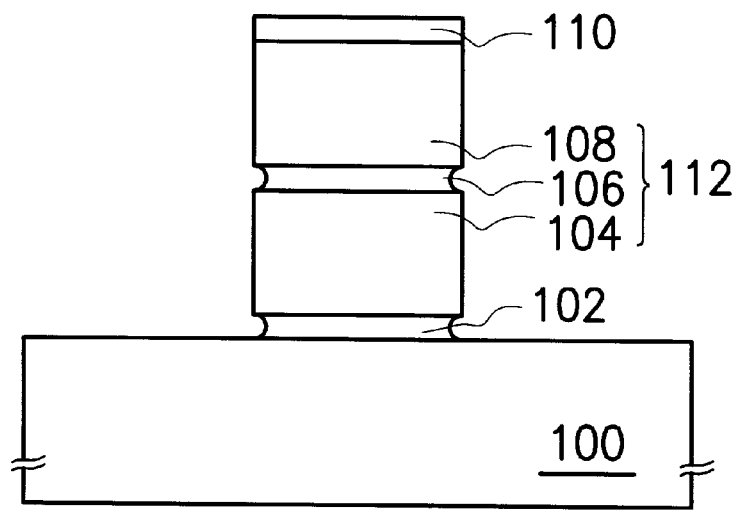
FIG. 1B is a cross-sectional view of a conventional polycide gate on a substrate showing some undercuts in the silicide layer and the gate oxide layer after a dry cleaning operation using plasma containing fluoride and oxygen.

If gaseous oxygen is added to the reactive gases, concentration of the fluoride free radicals will increase (following chemical reaction formula 2 & 3). Although the addition of molecular oxygen is capable of increasing the rate of dissociation of the high molecular weight residues, the rate of erosion of the sidewalls of a titanium nitride layer also increases (as shown in FIG. 1B).

$$O_{2(g)} \rightarrow 2O\cdot_{(g)} \tag{2}$$

$$CF_{4(g)} + O\cdot_{(g)} \rightarrow COF_{2(g)} + 2F\cdot_{(g)} \tag{3}$$

To prevent the erosion of the titanium nitride layer, gaseous hydrogen is added to the reactive gases instead of gaseous oxygen so that concentration of fluoride free radicals is reduced (following the chemical reaction formula 4 & 5). Hence, reactivity with titanium nitride is reduced and selectivity of fluoride free radical towards high molecular weight residues is boosted.

$$H_{2(g)} \rightarrow 2H\cdot_{(g)} \tag{4}$$

$$H\cdot_{(g)} + F\cdot_{(g)} \rightarrow HF_{(g)} \tag{5}$$

The first cleaning step need to be stopped after carrying out for some time because some high molecular weight residues will remain attached to the sidewalls no matter how long the process is continued. Furthermore, the longer the duration of the first cleaning operation, the greater will be the damages of the gate oxide layer caused by fluoride free radicals. Hence, it is preferably to remove the remaining high molecular weight residues by a cleaning operation easy on the gate oxide layer such as wet cleaning.

In the second cleaning step 304, a wet cleaning operation is carried out using an ammonium solvent. The ammonium solvent can be a conventional commercial product such as ACT 935.

In the third cleaning step 306, an oxidizing de-ionized water solution is applied to remove any remaining high molecular weight residues forming a structure as shown in FIG. 2C. The de-ionized water solution contains roughly 40 to 60 ppm of an oxidizing agent. The oxidizing agent, for example, can be the ozone produced by an ozone generator.

Since a small amount of fluoride-containing compound capable of triggering free radical chain reaction is used, photoresist material is removed efficiently. On the other hand, because only minute amount of fluoride-containing compound is used, erosion of the titanium nitride layer is prevented. In addition, any residual photoresist and organic high molecular substrate are removed by the subsequently applied ammonium compound solvent and the oxidizing solution. Hence, the gate structure is thoroughly cleaned without causing any conventional problems.

In summary, this invention provides a method of cleaning an etched polycide gate. First, a dry cleaning operation is carried out using plasma derived from a mixture of reactive gases including fluoride-containing gas, hydrogen and inert gas to remove a great portion of the photoresist layer and the high molecular weight residues. Wet cleaning operations are next carried out first using an ammonium class of solvent and then an oxidizing solution of de-ionized water to remove the remaining high molecular weight residues. Following these cleaning steps, the amount of high molecular weigh residues is greatly reduced without affecting the integrity of the sidewalls of titanium nitride layer and gate oxide layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of cleaning a polycide gate formed on a semiconductor substrate after a patterning operation, comprising:

conducting a first cleaning operation using plasma formed from a reactive gas mixture including fluoride-containing compound and gaseous hydrogen;

conducting a second cleaning operation using ammonium-based solvent; and conducting a third cleaning operation using a solution of ozone in de-ionized water.

2. The cleaning method of claim 1, wherein the first cleaning step is carried out at a reaction temperature of between about 80 to 150° C.

3. The cleaning method of claim 1, wherein the first cleaning step is carried out at a pressure of between about 0.6 to 0.9 torr.

4. The cleaning method of claim 1, wherein the fluoride-containing compound includes carbon tetrafluoride.

5. The cleaning method of claim 1, wherein the fluoride-containing compound includes trifluoromethane.

6. The cleaning method of claim 1, wherein the first cleaning steps further includes using gaseous nitrogen as a carrier.

7. The cleaning method of claim 6, wherein the ratio between fluoride-containing compound and gaseous nitrogen is about 0.01 to 0.03.

8. The cleaning method of claim 6, wherein the ratio between gaseous hydrogen and inert gas is about 0.04.

9. The cleaning method of claim 1, wherein the ammonium-based solvent includes the commercial product ACT 935.

10. The cleaning method of claim 1, wherein the amount of ozone in the deionized water is about 40 to 60 ppm.

11. A method of cleaning a polycide gate formed on a semiconductor substrate after a patterning operation, comprising:

conducting a first cleaning operation using plasma formed from a gaseous reactive mixture including a fluoride-containing compound, gaseous hydrogen and an inert gas, wherein the quantity of fluoride-containing compound used is just sufficient for initiating a free radical chain reaction;

conducting a second cleaning operation using an ammonium-based solvent; and conducting a third cleaning operation using a solution of oxidizing agent in de-ionized water.

12. The cleaning method of claim 11, wherein the reaction temperature of the plasma is between about 80 to 150° C.

13. The cleaning method of claim 11, wherein the pressure inside plasma reaction chamber is between about 0.6 to 0.9 torr.

14. The cleaning method of claim 11, wherein the inert gas includes nitrogen.

15. The cleaning method of claim 11, wherein the fluoride-containing compound includes carbon tetrafluoride.

16. The cleaning method of claim 11, wherein the fluoride-containing compound includes trifluoromethane.

17. The cleaning method of claim 11, wherein the ratio between fluoride-containing compound and inert gas is about 0.01 to 0.03.

18. The cleaning method of claim 11, wherein the ratio between gaseous hydrogen and inert gas is about 0.04.

19. The cleaning method of claim 11, wherein the ammonium-based solvent is selected from a commercial product ACT 935 and a commercial product ACT 970.

20. The cleaning method of claim 11, wherein the oxidizing agent includes ozone.

21. The cleaning method of claim 1, wherein substantially no gaseous oxygen is added to a reactive gas mixture of the plasma.

* * * * *